(12) United States Patent
Osada et al.

(10) Patent No.: US 7,083,759 B2
(45) Date of Patent: Aug. 1, 2006

(54) METHOD OF PRODUCING A HEAT DISSIPATION SUBSTRATE OF MOLYBDENUM POWDER IMPREGNATED WITH COPPER WITH ROLLING IN PRIMARY AND SECONDARY DIRECTIONS

(75) Inventors: Mitsuo Osada, Sakata (JP); Norio Hirayama, Sakata (JP); Tadashi Arikawa, Toyama (JP); Yoshinari Amano, Sakata (JP); Hidetoshi Maesato, Sakata (JP); Hidefumi Hayashi, Sakata (JP); Hiroshi Murai, Sakata (JP)

(73) Assignee: A.L.M.T. Corp., Tokyo (JP)

( * ) Notice: Subject to any disclaimer, the term of this patent is extended or adjusted under 35 U.S.C. 154(b) by 0 days.

(21) Appl. No.: 10/009,822

(22) PCT Filed: Apr. 12, 2001

(86) PCT No.: PCT/JP01/03164

§ 371 (c)(1),
(2), (4) Date: Dec. 13, 2001

(87) PCT Pub. No.: WO01/80313

PCT Pub. Date: Oct. 25, 2001

(65) Prior Publication Data
US 2002/0191377 A1    Dec. 19, 2002

(30) Foreign Application Priority Data

| Jan. 26, 2000 | (JP) | ................................ 2000/17584 |
| Apr. 14, 2000 | (JP) | ............................ 2000/113006 |
| Dec. 7, 2000 | (JP) | ............................ 2000/372405 |

(51) Int. Cl.
*B22F 3/02*    (2006.01)
*B22F 3/26*    (2006.01)
*B22F 7/02*    (2006.01)
*C21D 1/00*    (2006.01)

(52) U.S. Cl. .............................. 419/23; 419/8; 419/28; 419/42; 148/679; 148/684; 361/704; 228/262.6; 29/17.3; 29/530

(58) Field of Classification Search .................. 75/429, 75/646, 651, 652; 419/8, 23, 42, 68, 69, 419/27, 28; 29/875, 122, DIG. 31, 17.3, 29/527.7, 530, DIG. 32; 427/431, 432, 436; 228/262.7, 262.6, 116; 148/514, 536, 553, 148/554, 679, 680, 684; 361/204, 704
See application file for complete search history.

(56) References Cited

U.S. PATENT DOCUMENTS 5,086,333 A * 2/1992 Osada et al. .................. 357/67

(Continued)

FOREIGN PATENT DOCUMENTS

EP    0 170 867 A    6/1985

(Continued)

OTHER PUBLICATIONS

International Search Report (May 2001).

*Primary Examiner*—Michael E. Lavilla
(74) *Attorney, Agent, or Firm*—Sughrue Mion, PLLC

(57) ABSTRACT

A material for a semiconductor-mounting heat dissipation substrate comprises a copper-molybdenum rolled composite obtained by impregnating melted copper into a void between powder particles of a molybdenum powder compact to obtain a composite of molybdenum and copper and then rolling the composite. In a final rolling direction of a plate material, the coefficient of linear expansion is $8.3 \times 10^{-6}$/K at 30–800° C. The material for a semiconductor-mounting heat dissipation substrate is superior in thermal conductivity to a CMC clad material and easy in machining by a punch press. The substrate material is used as a heat dissipation substrate (13) of a ceramic package (11).

7 Claims, 3 Drawing Sheets

U.S. PATENT DOCUMENTS

| | | | |
|---|---|---|---|
| 5,167,697 A | 12/1992 | Koumura et al. | 75/247 |
| 5,493,153 A | 2/1996 | Arikawa et al. | |
| 6,271,585 B1 * | 8/2001 | Osada et al. | 257/712 |
| 6,693,353 B1 * | 2/2004 | Hirayama et al. | 257/746 |

FOREIGN PATENT DOCUMENTS

| | | | |
|---|---|---|---|
| JP | 59-061948 | * | 4/1984 |
| JP | 09 143649 A | | 11/1995 |
| JP | 08 092667 A | | 4/1996 |
| JP | 11-307701 | | 11/1999 |
| JP | 2000 026926 A | | 1/2000 |
| JP | 2000-216278 | * | 8/2000 |
| JP | 2000-223632 | * | 8/2000 |

* cited by examiner

<BEFORE ROLLING>

ENLARGED VIEW OF PART A

43 Mo PARTICLE
41 Cu

<AFTER ROLLING>

ENLARGED VIEW OF PART B

43 Mo PARTICLE
41 Cu

RELATIONSHIP BETWEEN ROLLING RATE AND
COEFFICIENT OF THERMAL EXPANSION

METHOD OF PRODUCING A HEAT DISSIPATION SUBSTRATE OF MOLYBDENUM POWDER IMPREGNATED WITH COPPER WITH ROLLING IN PRIMARY AND SECONDARY DIRECTIONS

BACKGROUND ART

This invention relates to a material for use in a heat dissipation substrate for a semiconductor in the fields of IC, microwaves, and optics and, in particular, to a heat dissipation substrate for mounting a semiconductor device, a heat dissipation member used in a ceramic package encapsulating a semiconductor and a metal package similarly encapsulating a semiconductor, and a method of producing the same.

Traditionally, a heat dissipation member for use in applications of the type is required to have an excellent heat conductivity and to have a coefficient of thermal expansion approximate to that of alumina ($Al_2O_3$), beryllia (BeO), or aluminum nitride (AlN) which is a main constituent material of the semiconductor or the package For the applications of the type, use has presently been made of a composite alloy obtained by sintering a compact of tungsten powder in a hydrogen atmosphere to produce a porous tungsten (W) material and impregnating the material with copper (Cu).

In recent years, the semiconductor is operated at a higher frequency and increased in capacity. This brings about a situation where the copper-tungsten composite alloy limited in heat conductivity is insufficient. Specifically, in case of a ceramic package using alumina as an insulator, the package is assembled by bonding alumina and a heat dissipation substrate by a silver brazing alloy. However, in order that the coefficient of thermal expansion of the composite alloy has a value approximate to that of alumina in a temperature range between normal temperature and about 780° C. at which the silver brazing alloy is solidified, the ratio of copper in the copper-tungsten composite must be suppressed between 10 and 13%. Therefore, limitation is imposed upon the thermal conductivity.

This is because the thermal conductivity of the composite is determined by its composition. If any defect such as a void is not present in the material and if constituent metals do not make a solid solution so that no alloy is produced, the thermal conductivity is determined by the ratio of the constituent metals. However, if a metal making a solid solution with the constituent metals is added, the thermal conductivity is decreased.

In case of the copper-tungsten composite alloy used as the heat dissipation substrate of the ceramic package encapsulating the semiconductor, a very small amount of an iron-group metal such as nickel (Ni) is generally added. The addition of the iron-group metal is applied in order to improve the wettability and to facilitate infiltration of copper into a void or gap in the porous tungsten material. By the above-mentioned addition, the thermal conductivity is decreased as compared with the binary composite of copper and tungsten.

On the other hand, in case of a combination of molybdenum (Mo) and copper, addition of any other metal is unnecessary because melted copper is excellent in wettability to molybdenum. In addition, since molybdenum and copper make no substantial solid solution, the thermal conductivity of a composite thereof is determined by a volumetric ratio therebetween.

In the meanwhile, the present inventors have already proposed a composite which is obtained by press-molding molybdenum powder to produce a powder compact and impregnating the powder compact with copper and which is excellent in thermal conductivity and suitable as a heat dissipation substrate for a semiconductor used in a large-capacity inverter or the like (see Japanese Patent Application No. 9-226361, hereinafter called a prior art 1).

The composite obtained by the prior art 1 is good in rollability. It has also been proposed that a heat dissipation substrate of a greater size is obtained by a rolling process.

Recently, a large-capacity semiconductor device accompanied with generation of a large amount of heat is used in an increased number of applications. One example is an inverter of an automobile energized by electricity as a driving force. In this case, it is necessary to convert electric power of several tens watts. When a semiconductor device having a rectifying function is driven, a large amount of heat is generated. In order to release the heat through a radiator to the outside of a car system, use is generally made of a following structure.

A rectifying device is mounted on an insulator substrate (such as AlN). A plurality of similar insulator substrates are fixed and attached to a large-sized heat dissipation substrate by soldering. The heat dissipation substrate is fixed to the radiator by screws or the like. The heat dissipation substrate is required to have an excellent heat conductivity and to have a heat expansion characteristic such that deformation resulting from a difference in coefficient of thermal expansion during cooling after soldering of the insulator substrates is suppressed small. Furthermore, the heat dissipation substrate is required to have a sufficient strength to allow the substrate to be fixed to the radiator by the screws or the like.

For the above-mentioned application, the present inventors have proposed a composite material of molybdenum and copper, which is manufactured without taking into account a rolling rate.

In view of energy saving in automobiles, there arises a demand for a heat dissipation substrate having a light weight in addition to the above-mentioned thermal characteristics. The light weight can be achieved by reducing the thickness of the heat dissipation substrate.

However, if the thickness of the heat dissipation substrate is reduced, the heat capacity is decreased. In addition, the deformation resulting from thermal strain due to the difference in coefficient of thermal expansion in case where the insulator substrates are soldered is increased as compared with the case where the thickness is great. The deformation is a hindrance to the contact between the substrate and the radiator and prevents transfer of the heat.

Thus, it is required to provide a material which is excellent in thermal conduction as compared with the composite material of molybdenum and copper according to the prior art 1 and which has a low coefficient of thermal expansion in a range such that occurrence of the problems related to the thermal strain upon soldering of the insulator substrates can be prevented.

For the above-mentioned application, AlN excellent in thermal conduction is generally used as the insulator substrate to be soldered to the heat dissipation substrate. During cooling after soldering the insulator substrate to the heat dissipation substrate, there arise problems, such as deformation of the heat dissipation substrate and fracture of the insulator substrate, as a result of the thermal strain. In order to prevent the occurrence of the above-mentioned problems, the material of the heat dissipation substrate is required to have a coefficient of thermal expansion of $9.0 \times 10^{-6}$/K or less at a temperature not higher than 400° C. This is because, if the material having a coefficient higher than $9.0 \times 10^{-6}$/K is used and if the heat dissipation substrate is soldered to ceramic such as AlN, deformation may be caused or cracks may be produced in a bonded portion or the ceramic itself during heat shrinkage.

On the other hand, apart from the application to the inverter of the electric automobile mentioned above, a ceramic package is used to mount a semiconductor device for producing microwaves in the field of communication or the like. In such ceramic package also, a heat dissipation substrate having following characteristics in addition to excellent thermal conduction is required in order to release heat produced by the semiconductor device to the outside of the package.

As the ceramic for the ceramic package, use is generally made of a material containing $Al_2O_3$ as a main component. For the heat dissipation substrate, it is required to use a material such that, in case where the substrate is bonded to the ceramic by a high-temperature (about 800° C.) brazing material (CuAg euticic brazing material or the like), the ceramic is not broken and the heat dissipation substrate is less deformed during cooling after brazing due to the thermal strain resulting from the difference in coefficient of thermal expansion from the ceramic.

In particular, in the event that the semiconductor device, such as GaAs, which produces high-temperature heat during operation and which is poor in thermal conduction is used, it is strongly desired to use a material excellent in thermal conduction at its surface to be contacted with the device. For this purpose, the Cu—W composite material generally used and the Mo—Cu composite material according to the prior art 1 may be insufficient in thermal conduction.

At present, use is sometimes made of a [Cu/Mo/Cu] clad material (hereinafter called CMC) in order to satisfy the above-mentioned requirement. However, the CMC clad material is disadvantageous in the following respects.

In the CMC clad material, a Cu layer as each surface layer is softened around a brazing temperature (800° C.) and is easily deformed during cooling. The clad material exhibits a thermal behavior similar to that of Mo. Therefore, as compared with the ceramic (generally containing $Al_2O_3$ as a main component) to be bonded, heat shrinkage is small so that the CMC composite is deformed. When the package is attached to a cooling device by screws or the like, the deformation prevents sufficient contact with the cooling device. Thus, there is a problem in cooling of the semiconductor.

Consideration will be made about mechanical characteristics of the substrate. Mo as an intermediate layer of the CMC clad material is brittle. Therefore, if a substrate part is punched out by a press from a plate material, cracks tend to occur in the Mo layer. In particular, the above-mentioned clad material has the soft Cu layers on both sides thereof. Therefore, it is difficult to prevent occurrence of the cracks in the Mo layer during punching. In view of the above, the substrate part must be produced by electric spark machining which generally requires high machining cost.

On the other hand, Cu—W and Cu—Mo generally used as the heat dissipation substrate for the semiconductor ceramic package are typically bonded by the silver brazing alloy. Since W and Mo are poor in wettability with the silver brazing material, the surface of the Cu—W or Cu—Mo substrate is subjected to Ni plating. Thus, brazing with the ceramic subjected to metallization requires a Ni plating process for the substrate. In addition, various problems, such as blister, stain, and discoloration, will be caused due to insufficient contact of a Ni plating layer. Thus, there is a problem in yield or reliability.

In view of the above, it is a first object of this invention to provide a method of producing a semiconductor-mounting heat dissipation substrate which is for use as a heat dissipation substrate of a ceramic package and which is superior in thermal conductivity to a CMC clad material and easy in machining by a punch press.

It is a second object of this invention to provide a method of producing the above-mentioned semiconductor-mounting heat dissipation substrate.

It is a third object of this invention to provide a semiconductor-mounting heat dissipation substrate of a copper-clad type, which has a thermal expansion characteristic such that various problems resulting from thermal strain are not caused even if it is brazed with ceramic.

It is a fourth object of this invention to provide a method of producing the above-mentioned semiconductor-mounting heat dissipation substrate of a copper-cladding type.

It is a fifth object of this invention to provide a ceramic package using the above-mentioned semiconductor-mounting heat dissipation substrate of a copper-clad type.

It is a sixth object of this invention to provide a method of producing the above-mentioned ceramic package.

DISCLOSURE OF THE INVENTION

In order to achieve the above-mentioned objects, the present inventors have worked and found out, as a heat dissipation substrate of a ceramic package which is superior in thermal conductivity to a CMC clad material and easy in machining by a punch press, a [Cu/Mo—Cu composite/Cu] clad material (CPC) which comprises a Mo—Cu composite decreased in coefficient of thermal expansion by increasing a working rate upon rolling and Cu layers affixed to both surfaces thereof and which has a thermal expansion characteristic such that various problems due to thermal strain do not occur even if it is brazed to ceramic. Thus, this invention has been made.

Specifically, according to this invention, there is provided a material for a semiconductor-mounting heat dissipation substrate, the material being a copper-molybdenum rolled composite obtained by infiltrating and filling (hereinafter may be referred to as impregnating) melted copper in a void or gap between powder particles of a molybdenum powder compact to produce a composite of molybdenum and copper and rolling the composite, the rolled composite having a coefficient of linear expansion of $8.3 \times 10^{-6}$/K or less at 30–800° C. in a final rolling direction in which a plate material is rolled.

According to this invention, there is also provided a material for a semiconductor-mounting heat dissipation substrate as described above, wherein the rolled composite is a rolled product subjected to primary rolling in one direction at a temperature of 100–300° C. and at a working rate of 50% or more and then subjected to secondary rolling as cold rolling in a direction intersecting with the one direction at a working rate of 50% or more, a total working rate being 60% or more, the coefficient of linear expansion in the secondary rolling direction at 30–800° C. being $7.2$–$8.3 \times 10^{-6}$/K.

According to this invention, there is also provided a material for a semiconductor-mounting heat dissipation substrate of a copper-clad type, comprising a copper/copper-molybdenum composite/copper clad material formed by press-bonding copper plates to both surfaces of a rolled composite, the rolled composite being the above-mentioned material for a semiconductor-mounting heat dissipation substrate.

According to this invention, there is also provided a material for a semiconductor-mounting heat dissipation substrate of a copper-clad type as described above, wherein the copper-molybdenum composite forming an intermediate layer has a coefficient of linear expansion of $8.3\times10^{-6}$/K or less at a temperature not higher than 400° C. by controlling the ratio of copper and molybdenum and the reduction percentage, the material having a coefficient of linear expansion of $9.0\times10^{-6}$/K or less at a temperature not higher than 400° C.

According to this invention, there is also provided a material for a semiconductor-mounting heat dissipation substrate of a copper-clad type as described above, wherein the copper-molybdenum composite forming an intermediate layer has a coefficient of linear expansion of $8.3\times10^{-6}$/K or less at a temperature of 30–800° C., the material having a coefficient of linear expansion of $9.0\times10^{-6}$/K or less at a temperature of 30–800° C.

According to this invention, there is also provided a ceramic package comprising a heat dissipation substrate made of the above-mentioned material for a semiconductor-mounting heat dissipation substrate of a copper-clad type.

According to this invention, there is also provided a method of producing a material for a semiconductor-mounting heat dissipation substrate, comprising the steps of press-forming molybdenum powder having an average particle size of 2–5 μm at a pressure of 100–200 MPa to obtain a molybdenum powder compact, impregnating melted copper into a void between powder particles of the molybdenum powder compact in a nonoxidizing atmosphere at 1200–1300° C. to obtain a composite of molybdenum and copper which contains 70–60% molylbdenum in weight ratio, the balance copper, and rolling the composite at a working rate of at least 60% to produce a rolled composite, the rolled composite having a coefficient of linear expansion of $8.3\times10^{-6}$/K or less at 30–800° C. in a final rolling direction.

It is noted here that, in this invention, if the impregnating temperature is lower than 1200° C., Cu has a high viscosity and does not sufficiently infiltrate into the powder compact to leave a void or the like. If the impregnating temperature is higher than 1300° C., the viscosity of Cu is lowered to cause leakage of Cu which has infiltrated. On the other hand, if the total working rate is lower than 60%, Mo is not sufficiently processed or rolled. This makes it difficult to control the coefficient of linear expansion.

According to this invention, there is also provided a method of producing a material for a semiconductor-mounting heat dissipation substrate as described above, comprising a rolling process in which primary rolling is carried out in one direction at a temperature of 100–300° C. and at a working rate of 50% or more and secondary rolling is carried out as cold rolling in a direction intersecting with the one direction at a working rate of 50% or more, a total working rate being 60% or more, thereby producing a rolled composite of molybdenum and copper which has a coefficient of linear expansion of $7.2-8.3\times10^{-6}$/K at 30–800° C. in the secondary rolling direction.

According to this invention, there is also provided a method of producing a material for a semiconductor-mounting heat dissipation substrate of a copper-clad type, wherein the above-mentioned method of producing a material for a semiconductor-mounting heat dissipation substrate further comprises the step of press-bonding copper plates to both surfaces of the rolled composite.

According to this invention, there is also provided a method of producing a material for a semiconductor-mounting heat dissipation substrate of a copper-clad type as described above, comprising the steps of rolling the copper-molybdenum composite as an intermediate layer with the ratio of copper and molybdenum and the reduction percentage controlled so that a resultant rolled composite has a coefficient of linear expansion equal to $8.3\times10^{-6}$/K or less at a temperature not higher than 400° C., and thereafter press-bonding copper on both surfaces of the rolled composite to obtain a copper-clad rolled composite having a coefficient of linear expansion of $9.0\times10^{-6}$/K or less at a temperature not higher than 400° C.

According to this invention, there is also provided a method of producing a material for a semiconductor-mounting heat dissipation substrate of a copper-clad type as mentioned above, comprising the steps of obtaining the copper-molybdenum composite forming an intermediate layer having a coefficient of linear expansion of $8.3\times10^{-6}$/K or less at a temperature of 30–800° C. by controlling the ratio of copper and molybdenum and the reduction percentage, and press bonding copper on both surfaces of the copper-molybdenum composite to obtain a copper-clad rolled composite having a coefficient of linear expansion of $9.0\times10^{-6}$/K or less at a temperature of 30–800° C.

According to this invention, there is also provided a method of producing a ceramic package, wherein the above-mentioned method of producing a material for a semiconductor-mounting heat dissipation substrate of a copper-clad type further comprises the step of directly brazing the copper-clad rolled composite with ceramic having a metallize layer affixed to its surface.

According to this invention, there is also provided a method of producing a material for a heat dissipation substrate for a semiconductor ceramic package, wherein the method utilizes the above-mentioned method of producing a material for a semiconductor-mounting heat dissipation substrate of a copper-clad type and comprises the steps of obtaining the copper-molybdenum composite forming an intermediate layer having a coefficient of linear expansion of $7.9\times10^{-6}$/K or less at a temperature of 30–800° C. by controlling the ratio of copper and molybdenum and the reduction percentage, and press-bonding copper onto both surfaces of the copper-molybdenum composite to obtain a copper-clad rolled composite having a coefficient of linear expansion of $9.0\times10^{-6}$/K or less at a temperature of 30–800° C.

BEST MODE FOR EMBODYING THE INVENTION

Figure 1:
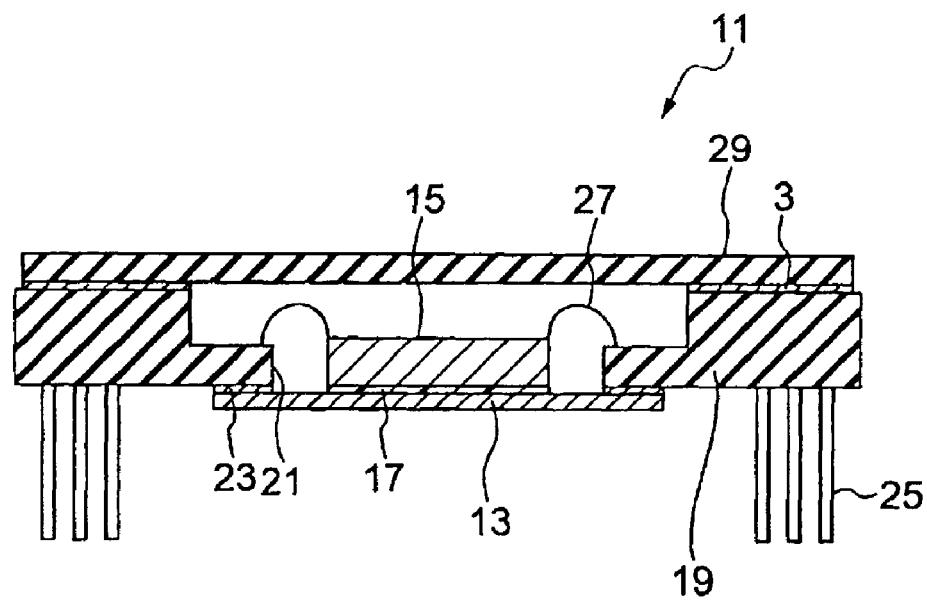
FIG. 1 is a view showing one example of a ceramic package in which a rolled composite plate according to an embodiment of this invention is mounted.

Referring to FIG. 1, a ceramic package 11 uses a copper-clad rolled composite plate or a rolled composite plate as a heat dissipation substrate 13. On the heat dissipation substrate 13, a semiconductor chip 15 is fixed and connected via an adhesive 17. Ceramic 19 as a main body of the ceramic package 11 has an aperture 21 formed at the center of its bottom. Through the aperture 21, the semiconductor chip 15 is inserted into the ceramic 19. A surface of the ceramic 19 outside the aperture 21 and the heat dissipation substrate 13 are bonded through a silver brazing alloy 23. Thus, the ceramic 19 around the semiconductor chip 15 is covered with the heat dissipation substrate 13.

The ceramic 19 is provided with pins 25 protruding on the side of the rolled composite plate 13 as terminals to be connected to a substrate which is not illustrated in the figure or a connector mounted on the substrate. These pins 25 and the semiconductor chip 15 are electrically connected through bonding wires 27. The ceramic 19 and a ceramic lid 29 covering the ceramic are bonded through a low-melting-point glass to enclose the semiconductor chip 15 within the package.

Figure 2:
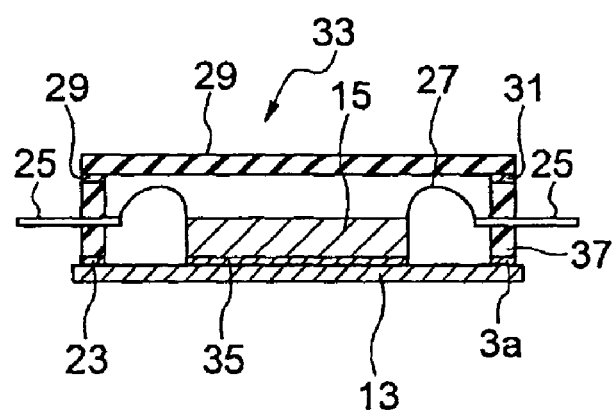
FIG. 2 is a view showing another example of the ceramic package in which the rolled composite plate according to the embodiment of this invention is mounted.

Referring to FIG. 2, a ceramic package 33 has a structure in which the semiconductor chip 15 is bonded onto the rolled composite plate 13 as the heat dissipation substrate via an AuSn solder 35. The heat dissipation substrate 13 with the semiconductor chip 15 mounted thereon is bonded to ceramic 37 via the silver brazing alloy 23 to close one end thereof. Thus, the semiconductor chip 15 is encapsulated in the interior of the ceramic 37. The semiconductor chip 15 is electrically connected through the bonding wires 27 to inner ends of the pins 25 penetrating through side surfaces of the ceramic 37. The ceramic 37 has the other end sealed by bonding the ceramic lid 29 through the low-melting-point glass 31, in the manner similar to the example illustrated in FIG. 1.

Next, the heat dissipation substrate used in FIGS. 1 and 2 will be described in detail.

The present inventors have found out that, like the rolled product comprising the composite according to the prior art mentioned above, a material having an extremely small coefficient of thermal expansion at a high temperature can be obtained if heavy rolling exceeding 60% is performed. The rolled product is manufactured in the following manner. Molybdenum powder having an average particle size of 2–4 μm is press-formed at a temperature of 100–200 MPa to obtain a molybdenum powder compact. Into a void between powder particles of the molybdenum powder compact, melted copper is impregnated in a non-oxidizing atmosphere at 1200–1300° C. to obtain a Cu—Mo composite consisting of 70–60% molybdenum in weight ratio, the balance copper. The composite is subjected to primary rolling in one direction at a temperature of 100–300° C. and at a working rate of 50% or more and then to secondary rolling as cold rolling at a working rate of 50% or more in a direction perpendicular to the one direction, thereby obtaining a rolled product with a total working rate of 60% or more. The rolled product has a coefficient of linear expansion of $7.2-8.3 \times 10^{-6}$/K at 30–800° C. in the secondary rolling direction.

The rolled product has an extremely small coefficient of thermal expansion because, following an increase in rolling rate, molybdenum particles in the composite are elongated in the rolling direction to change a microstructure of the composite.

In view of the above, a molybdenum-copper composite is rolled at an increased working rate so that a coefficient of thermal expansion is $8.3 \times 10^{-6}$/K or less at a temperature not higher than 400° C. Next, copper layers having a high thermal conductivity are affixed to both surfaces of the molybdenum-copper composite. As a consequence, a [copper/molybdenum-copper composite/copper] clad material (hereinafter called CPC) is obtained which has a thermal conductivity superior to that of the molybdenum-copper composite and a coefficient of thermal expansion as a clad material not higher than $9.0 \times 10^{-6}$/K.

It is assumed that such a rolled composite plate but having a coefficient of thermal expansion of $8.3 \times 10^{-6}$/K or more is used as a heat dissipation substrate. In this event, when ceramic such as alumina is silver-brazed for packaging, deformation may be caused or cracks may be produced in a bonded portion or the ceramic itself during heat shrinkage. Thus, the use of the above-mentioned rolled composite plate is inappropriate.

Figure 3:
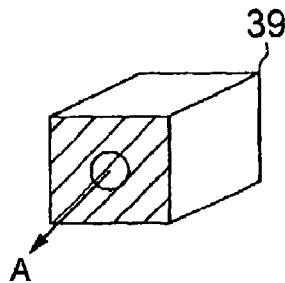
FIG. 3 is a perspective view showing a composite before rolling.
Figure 4:
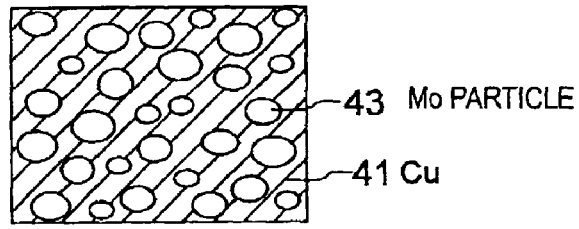
FIG. 4 is an enlarged view of a part A in FIG. 3.
Figure 5:
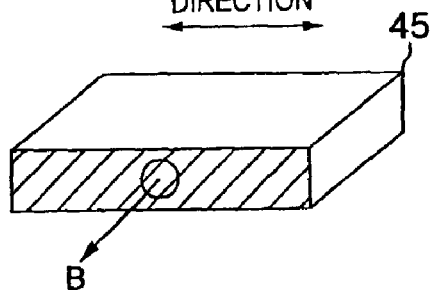
FIG. 5 is a perspective view showing the composite after rolling.
Figure 6:
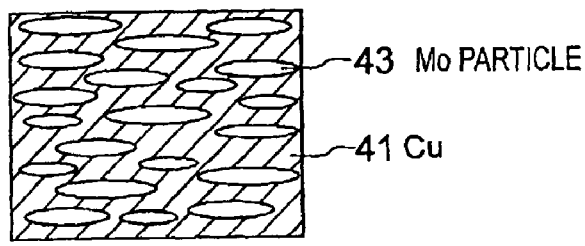
FIG. 6 is an enlarged view of a part B in FIG. 5.

Referring to FIGS. 3 and 4, a composite 39 prior to rolling includes circular-section Mo particles 43 dispersed in a matrix of Cu 41. On the other hand, as illustrated in FIGS. 5 and 6, a composite 45 after rolling has a structure in which the Mo particles 43 in the matrix of Cu 41 have a collapsed shape flattened in the rolling direction.

Figure 7:
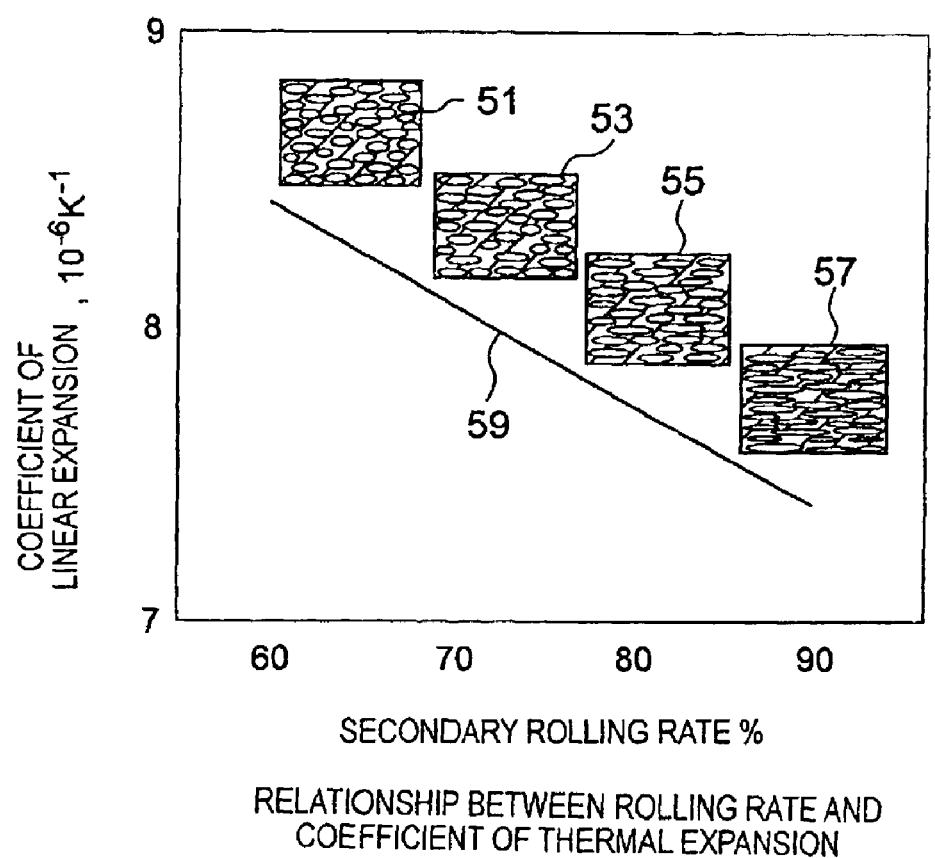
FIG. 7 is a view showing the relationship between the reduction percentage and the coefficient of linear expansion as well as a conceptual view of a granular structure in each state.

As illustrated in FIG. 7, following the increase in secondary rolling rate, the Mo particles are gradually flattened in the order of reference numerals 51, 53, 55, and 57 and the coefficient of linear expansion is linearly decreased, as depicted by a straight line 59. Thus, the composite material of molybdenum and copper which is produced by the method of this invention can be lowered in coefficient of thermal expansion following the increase in working rate upon rolling.

The CPC produced according to this invention has following characteristics as compared with the CMC.

At first, the intermediate layer comprises the Mo—Cu composite and contains copper. Therefore, it is possible to lower the temperature upon hot rolling for adhesion of the composite to copper. This brings about energy saving and high adhesion force. Because of little difference in deformability between the cladding material and the intermediate layer, deformation of the layers as a result of rolling is small and the quality is stable. The thermal characteristics are superior to those of the CMC because not only heat diffusion is performed in a horizontal (XY) direction but also copper is present in a thickness (Z) direction. As regards the coefficient of thermal expansion, there is no problem because, by controlling the working rate of the Mo—Cu composite material as the intermediate layer without changing the thickness of the Cu layers, the coefficient of thermal expansion of $8.3 \times 10^{-6}$/K or less, which allows matching with the ceramic, is obtained. Furthermore, Ni platability is more excellent because less exposure of Mo.

Hereinafter, description will be made of specific examples of production of a rolled composite plate according to this invention.

EXAMPLE 1

Molybdenum powder having an average particle size of 4 μm was subjected to hydrostatic press forming at a hydraulic pressure of 150 MPa to form a rectangular plate in a dimension of a thickness (T) 12.5×180×175 mm. A copper plate of T5×175×175 mm was put on the rectangular plate and heated in a hydrogen atmosphere at 1300° C. so that copper was melted and impregnated into a void in the molybdenum molded product. Thus, a Cu—Mo composite having a dimension of T12×173×168 mm and containing 35% copper in weight ratio was obtained. The composite was heated to 200° C. and repeatedly subjected to primary rolling at a 20% or less reduction until a predetermined thickness was obtained. Thus, a composite rolled plate of the thickness $T_1 \times 173 \times L$ mm was formed. Furthermore, secondary rolling (in a crossing direction) was performed at room temperature in a direction perpendicular to the primary rolling direction until $T_2$ of 1.1 mm is achieved. The list of the results is shown in Table 1. Specifically, rolled composite plates having coefficients of linear expansion of 7.0–8.4× $10^{-6}$/K at 800° C. were obtained. From these rolled plates A–F, test pieces of 10×40 mm were cut out. Each test piece was subjected to nickel plating and then hot-brazed at 850° C. to a ceramic frame containing 99.5% or more $Al_2O_3$ (after one surface was metallized by tungsten, Ni-plating was performed thereon) by the use of a silver brazing alloy having a silver-copper eutectic composition. Thus, the ceramic package illustrated in FIG. 1 or 2 was produced and the warp of Mo—Cu as a bottom plate was measured. The measured values are shown in Table 2.

As shown in Tables 1 and 2, the warp is increased in a convex shape when the coefficient of linear expansion exceeds 8.4×$10^{-6}$/K (rolled plate A). On the other hand, when the coefficient of thermal expansion is smaller than 7.2×$10^{-6}$/K or less (rolled plates E, F), the warp is increased in a concave shape. Therefore, the use of the rolled plate A, E, or F as a practical substrate caused a defect.

On the other hand, the rolled plates B–D exhibited small warp and can therefore be used as the substrate without any problem.

TABLE 1

|  | Type | | | | | |
| --- | --- | --- | --- | --- | --- | --- |
|  | A | B | C | D | E | F |
| Primary Thickness $T_1$ (mm) | 3.1 | 3.7 | 3.4 | 5.5 | 8.0 | 12.0 |
| Secondary Thickness $T_2$ (mm) | 1.1 | 1.1 | 1.1 | 1.1 | 1.1 | 1.1 |
| Secondary Rolling Rate (%) | 65 | 70 | 75 | 80 | 86 | 91 |
| Coefficient of Linear Expansion Secondary Rolling Direction | | | | | | |
| (30–400° C.) | 9.0 | 8.7 | 8.5 | 8.1 | 7.7 | 7.5 |
| (30–800° C.) | 8.4 | 8.2 | 7.9 | 7.6 | 7.2 | 7.0 |

Coefficient of Linear Expansion: in $10^{-6}$/K

TABLE 2

| Type | A | B | C | D | E | F |
| --- | --- | --- | --- | --- | --- | --- |
| Deformation of Bottom Plate (μm) | +28~+22 | +13~+1 | +7~−15 | −1~−15 | −23~−35 | −33~−45 |

< +: convex warp, −: concave warp >

EXAMPLE 2

According to the conditions in the rolled plate E in Example 1, an impregnated product having a thickness of 18 mm was obtained. The impregnated product was rolled by primary rolling to $T_1$ of 15 mm and finished by secondary rolling to obtain a Cu—Mo composite having $T_2$ of 3 mm. The Cu—Mo composite were sandwiched by Cu plates having T of 1 mm and attached to upper and lower surfaces thereof, and held in an electric furnace in a hydrogen atmosphere heated to 800° C. for 15 minutes. The sandwiched composite was made to pass through a roll at a 10% initial reduction (hot rolling) to press-bond Cu and the Cu—Mo composite. It is noted here that the CMC (Cu/Mo/Cu multilayer material) requires heating at 850° C. or more and the initial reduction of 20% or more. Thus, press-bonding of Cu and the Cu—Mo composite is more economical and easier.

Next, surface treatment was performed to remove oxide or the like. Thereafter, rolling was repeatedly carried out at a 10% or less reduction to obtain a clad material of Cu/Cu—Mo composite/Cu having T of 2 mm. At this time, the layer ratio is 1:4:1. Hereinafter, the clad material will be called CPC141.

The CPC 141 had a coefficient of linear expansion of 8.2×$10^{-6}$/K at 400° C. The rolled plate was processed in the manner similar to Example 1 and soldered to a ceramic frame containing AlN to produce a ceramic package like in Example 1. In the ceramic package, the warp of the Mo—Cu bottom plate was measured. As a result, the warp was as good as +10 μm (convex warp). Any defect such as cracks was not caused in a soldered portion or a ceramic portion.

EXAMPLE 3

Under the conditions of the rolled plate D in Example 1, rolling was carried out to obtain a Cu—Mo composite having a thickness T of 1.1 mm. The Cu—Mo composite was sandwiched by Cu plates having T of 0.4 mm and attached to upper and lower surfaces thereof and press-bonded by rolling in the manner similar to Example 2 to obtain a composite. The composite is a CPC clad material of Cu/Cu—Mo composite/Cu (layer ratio being 1:4:1) having a thickness T of 1.0 mm. The CPC 141 had a coefficient of linear expansion of 8.2×$10^{-6}$/K at 800° C. The rolled plate was processed in the manner similar to Example 1 and Ag brazed to a ceramic frame containing $Al_2O_3$ to produce a ceramic package like in Example 1. The warp of the Mo—Cu bottom plate was measured. As a result, the warp was as good as +11 μm (convex warp). Any defect such as cracks was not caused in a brazed portion or a ceramic portion.

EXAMPLE 4

Under the condition of the rolled plate E in Example 1, rolling was carried out to obtain a Cu—Mo composite having a thickness T of 1.1 mm. The Cu—Mo composite was sandwiched by Cu plates having T of 0.4 mm and attached to upper and lower surfaces thereof and press-bonded by rolling in the manner similar to Example 2 to obtain a composite. The composite is a CPC clad material of Cu/Cu—Mo composite/Cu (layer ratio being 1:4:1) having a thickness T of 1.0 mm. The CPC 141 had a coefficient of linear expansion of 7.8×$10^{-6}$/K at 800° C. The rolled plate was processed in the manner similar to Example 1 and Ag brazed to a ceramic frame containing $Al_2O_3$ to produce a ceramic package like in Example 1. In the ceramic package, the warp of the Mo—Cu bottom plate was measured. As a result, the warp was as good as +5 μm (convex warp). Any defect such as cracks was caused in a brazed portion or a ceramic portion.

As described above, according to this invention, it is possible to provide a semiconductor-mounting heat dissipation substrate which is for use as a heat dissipation substrate of a ceramic package and which is superior in thermal conductivity to a CMC clad material and easy in machining by a punch press and to provide a method of producing the same.

According to this invention, it is also possible to provide a semiconductor-mounting heat dissipation substrate of a copper-clad type, which has a thermal expansion characteristic such that various problems resulting from thermal strain are not caused even if it is brazed with ceramic and to provide a method of producing the same.

According to this invention, it is also possible to provide a ceramic package in which the semiconductor-mounting heat dissipation substrate of a copper-clad type having the above-mentioned advantages is mounted without being subjected to Ni plating.

INDUSTRIAL APPLICABILITY

As described above, the semiconductor-mounting heat dissipation substrate according to this invention is most suitable as the heat dissipation substrate of the ceramic package or the like.

The invention claimed is:

1. A method of producing a material for heat dissipation substrate for mounting a semiconductor chip, comprising the steps of:
    press-forming molybdenum powder having an average particle size of 2–4 μm at a pressure of 100–200 MPa to obtain a molybdenum powder compact;
    impregnating melted copper into a void between powder particles of the molybdenum powder compact in a nonoxidizing atmosphere at 1200–1300° C. to obtain a composite of molybdenum and copper which contains 70–60% molybdenum in weight ratio, the balance copper;
    primary rolling the composite in one direction as a first rolling direction at a temperature of 100–300° C. and at a working rate of 50% or more; and
    secondary rolling the composite as cold rolling in a direction intersecting with the one direction as a second rolling direction at a working rate of 50% or more after the step of primary rolling,
    wherein a total working rate is 75% or more when primary rolling and secondary rolling so as to produce a rolled composite of molybdenum and copper which has a coefficient of linear expansion of $8.2 \times 10^{-6}$/K or less at 800° C. in the second rolling direction.

2. A method as claimed in claim 1, wherein each of said steps of primary and secondary rolling is repeatedly carried out so as to extend particles of molybdenum contained in the composite to the first and the second rolling directions and form the particles into a flat shape.

3. A method as claimed in claim 1, further comprising the step of press-bonding copper plates to both surfaces of the rolled composite to obtain a substrate for a semiconductor-mounting heat dissipation substrate having a copper-clad, said substrate having a coefficient of linear expansion of $8.2 \times 10^{-6}$/K or less at 800° C.

4. A method as claimed in claim 3, wherein said steps of primary rolling and secondary rolling the copper-molybdenum composite as an intermediate layer are carried out with the ratio of copper and molybdenum and a reduction percentage controlled so that a resultant rolled composite has a coefficient of linear expansion of $8.2 \times 10^{-6}$/K or less at 800° C., and thereafter the step of press-bonding copper on both surfaces of the rolled composite is carried out to obtain a copper-clad rolled composite having a layer ratio of 1:4:1 of Cu/Cu—Mo composite/Cu and a coefficient of linear expansion of $8.2 \times 10^{-6}$/K or less at 800° C.

5. A method as claimed in claim 3, wherein said steps of primary rolling and the secondary rolling the copper-molybdenum composite as an intermediate layer is carded out with the ratio of copper and molybdenum and a reduction percentage controlled so that a resultant rolled composite has a controlled coefficient of linear expansion to $8.2 \times 10^{-6}$/K or less at 800° C., and thereafter said step of press bonding copper on both surfaces of the copper-molybdenum composite is repeatedly carried out at a predetermined reduction ratio to obtain a copper-clad rolled composite having a layer ratio controlled coefficient of linear expansion to $8.2 \times 10^{-6}$/K or less at 800° C.

6. The method as claimed in claim 5, wherein said predetermined reduction ratio is approximately 10%.

7. A method of producing a ceramic package, comprising:
    press-forming molybdenum powder having an average particle size of 2–4 μm at a pressure of 100–200 MPa to obtain a molybdenum powder compact;
    impregnating melted copper into a void between powder particles of the molybdenum powder compact in a nonoxidizing atmosphere at 1200–1300° C. to obtain a copper-molybdenum composite containing 70–60% molybdenum in weight ratio, the balance copper; and
    primary rolling the composite in one direction as a first rolling direction at a temperature of 100–300° C. and at a working rate of 50% or more;
    secondary rolling the composite as cold rolling in a direction intersecting with the one direction as a second rolling direction at a working rate of 50% or more after the step of primary rolling to produce a rolled;
    press-bonding copper plates to both surfaces of the rolled composite to obtain a copper-clad rolled composite having a coefficient of liner expansion of $8.2 \times 10^{-6}$/K or less at 800° C.; and
    directly brazing the copper-clad rolled composite with ceramic having a metal layer affixed to a surface of the ceramic.

* * * * *